(12) United States Patent
Fung

(10) Patent No.: US 8,015,382 B1
(45) Date of Patent: Sep. 6, 2011

(54) METHOD AND APPARATUS FOR STROBE-BASED SOURCE-SYNCHRONOUS CAPTURE USING A FIRST-IN-FIRST-OUT UNIT

(75) Inventor: Ryan Fung, Mississauga (CA)

(73) Assignee: Altera Corporation, San Jose, CA (US)

( * ) Notice: Subject to any disclaimer, the term of this patent is extended or adjusted under 35 U.S.C. 154(b) by 902 days.

(21) Appl. No.: 11/712,143

(22) Filed: Feb. 28, 2007

(51) Int. Cl.
*G06F 13/00* (2006.01)
(52) U.S. Cl. .......................................... 711/167; 710/61
(58) Field of Classification Search .................. None
See application file for complete search history.

(56) References Cited

U.S. PATENT DOCUMENTS

| 5,634,043 | A | * | 5/1997 | Self et al. ...................... 713/503 |
| 7,123,051 | B1 | * | 10/2006 | Lee et al. ......................... 326/40 |
| 7,187,741 | B2 | * | 3/2007 | Pontius et al. ................ 375/372 |
| 7,505,521 | B2 | * | 3/2009 | Cho et al. ....................... 375/257 |
| 7,646,668 | B2 | * | 1/2010 | Udell et al. ................... 365/236 |

* cited by examiner

*Primary Examiner* — Hetul Patel
(74) *Attorney, Agent, or Firm* — L. Cho

(57) ABSTRACT

A source-synchronous capture unit includes a data register unit to register data synchronized to a strobe or non-free running clock. The source synchronous capture unit also includes an asynchronous first-in-first-out (FIFO) unit to store the data from the data register unit in response to the strobe or non-free running clock and to output the data stored, in response to another clock.

22 Claims, 6 Drawing Sheets

METHOD AND APPARATUS FOR STROBE-BASED SOURCE-SYNCHRONOUS CAPTURE USING A FIRST-IN-FIRST-OUT UNIT

FIELD OF THE INVENTION

Embodiments of the present invention relate to hardware for supporting source synchronous standards such as that used with double-data-rate (DDR) memory. More specifically, embodiments of the present invention relate to a method and apparatus for strobe-based source-synchronous capture using a first-in-first-out (FIFO) buffer.

BACKGROUND OF THE INVENTION

Source synchronous communication standards are important to enable high-speed data transfer between devices. Board skews and delay variation make it challenging to complete a synchronous transfer with a single central board clock or even a single clock forwarded with a large number of data bits. Consequently, what is typically done is a large data bus is divided into small groups of bits and a clock or strobe associated with each group of bits is forwarded along with the respective data. An assumption is made that any board skew or delay variation will affect both the clock or strobe and data bits in each group such that the clock or strobe can be reliably used to capture the respective data.

One issue with this approach is that data synchronized to various different clocks or strobes must often be synchronized to a single clock in the receiving device to facilitate data processing on all the data received. There are a few known approaches that have been used to achieve this in programmable-logic devices (PLDs), or, more specifically, field-programmable gate arrays (FPGAs).

One uses run-time controllable delay chains on the input data paths to delay the data as necessary so it can be successfully captured by a single clock in the receiving device. To achieve this, it is important to figure out the phase relationship between the incoming data and the clock in the receiving device. This can be done on a group basis (data bits and associated clock/strobe) by sampling different delayed versions of the clock/strobe with the clock in the receiving device. Using that information, the data can be appropriately delayed to facilitate reliable capture. The disadvantage of this approach is the complexity associated with the hardware needed to support dynamic delay calibration to adjust delays for process/voltage/temperature variations. There can be additional complexity in the controller logic to keep the data capture reliable and ensure all the data is aligned.

In another approach, the clock within the receiving device can be adjusted so that the data can be reliably transferred directly from the clock/strobe domains to the receiving device clock domain. This approach may be combined with circuitry (in the 10 periphery of FPGAs) that capture the data using the strobe and de-serialize it so that the data is still synchronous to the strobe, but it toggles at a more manageable frequency (which is desirable for FPGAs that have slower core logic speeds than comparable ASICs). That lower-frequency data is then re-synchronized to a receiving device clock domain. A disadvantage with this approach is it can be difficult if not impossible to determine a single clock phase within the receiving device that will suit all the clock/strobe domains at high speeds.

Another challenge with source-synchronous transfer relates to the fact that strobe signals may not be free-running. That is, there may be times when the strobe is not active. This complicates some synchronization approaches. For example, the sampling circuitry in the first approach above needs to know when the strobe stops so it does not de-calibrate when it sees an inactive strobe. In approaches that use the strobe to clock registers in the receiving device, the strobe needs to be gated or electrically filtered so that noise in the inactive strobe does not incorrectly trigger registers. Thus, what is needed to enable FPGA strobe-based source-synchronous capture is a method and apparatus to reliably and conveniently perform re-synchronization of data from strobe domains to a receiving device clock domain.

SUMMARY

According to an embodiment of the present invention, an asynchronous FIFO unit is used to perform re-synchronization of data from a non-free-running strobe domain to a receiving device clock domain to complete a source synchronous transfer. The asynchronous FIFO unit includes a write clock port and a read clock port which can be connected to (phase) independent clocks. Data may be written into the write side of the asynchronous FIFO, and data may be read out on the read side of the asynchronous FIFO in the same order which the data was written. The asynchronous FIFO unit performs resynchronization without requiring specially-calibrated data-path delay elements, hardware which supports dynamic delay calibration of those delay elements, state machines which keep data aligned, and clock-phase re-calibration circuitry. This approach also avoids the timing marginality associated with transferring data directly and synchronously from multiple strobe domains to a single clock domain that may be difficult to determine; the FIFO units handle these transfers asynchronously, and independently, so no timing window interactions need to be considered.

BRIEF DESCRIPTION OF THE DRAWINGS

The features and advantages of embodiments of the present invention are illustrated by way of example and are not intended to limit the scope of the embodiments of the present invention to the particular embodiments shown.

DETAILED DESCRIPTION

In the following description, for purposes of explanation, specific nomenclature is set forth to provide a thorough understanding of embodiments of the present invention. It will be apparent to one skilled in the art that specific details in the description may not be required to practice the embodiments of the present invention. In other instances, wellknown circuits, devices, and components are shown in block diagram form to avoid obscuring embodiments of the present invention unnecessarily.

Figure 1:
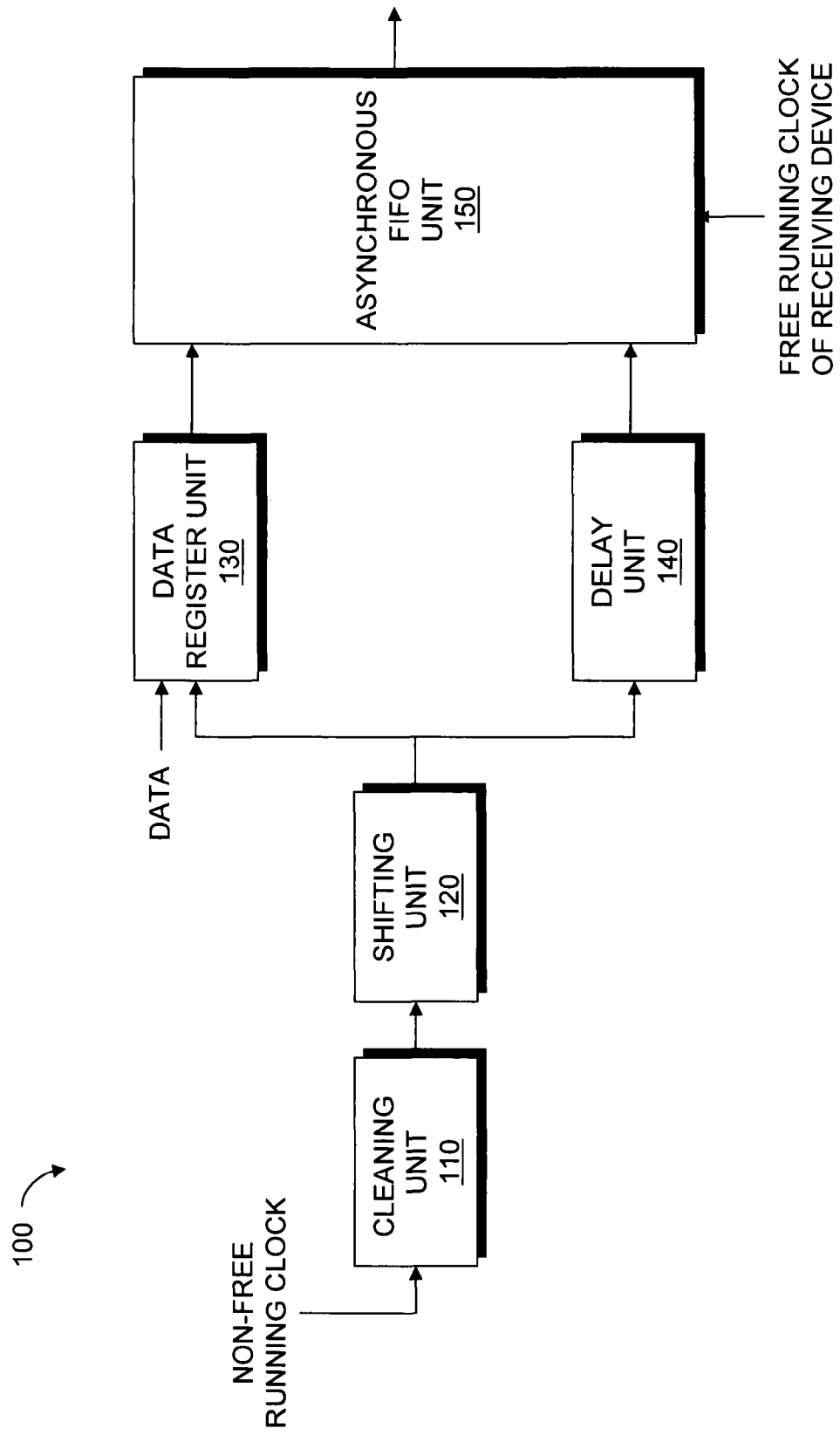
FIG. 1 is a block diagram of a source synchronous capture unit according to an exemplary embodiment of the invention.

FIG. 1 is a block diagram of a source synchronous capture unit 100 according to an exemplary embodiment of the invention. The source synchronous capture unit 100 may be used at a receiving device to capture source synchronous data from a transmitting device and to synchronize the data to a receiving device clock. The source synchronous capture unit 100 can support source-synchronous communication standards, such as DDR, that do not send a free-running clock along with the data. A non-free running clock, such as a strobe, may be transmitted with the data that only toggles when the data is being sent. The source synchronous capture unit 100 includes a cleaning unit 110. The cleaning unit 110 adjusts the non-free running clock so that it may be used directly for capture. The cleaning unit 110 may gate the non-free running clock with logic that performs an AND function and a control (enable) signal that is timed to be high when the non-free running clock is active. It should be appreciated that other techniques, such as electrical methods based on level detection of the non-free running clock to interpret an intermediate voltage level as high or low, may be used to clean up the non-free running clock.

The source synchronous capture unit 100 includes a shifting unit 120. The shifting unit 120 shifts the non-free running clock to facilitate data capture so that the edges of the non-free running clock are centered in the data valid window. According to one embodiment, a delay lock loop may be used to calibrate a delay chain to shift the non-free running clock. It should be appreciated that other techniques may be used.

Figure 2:
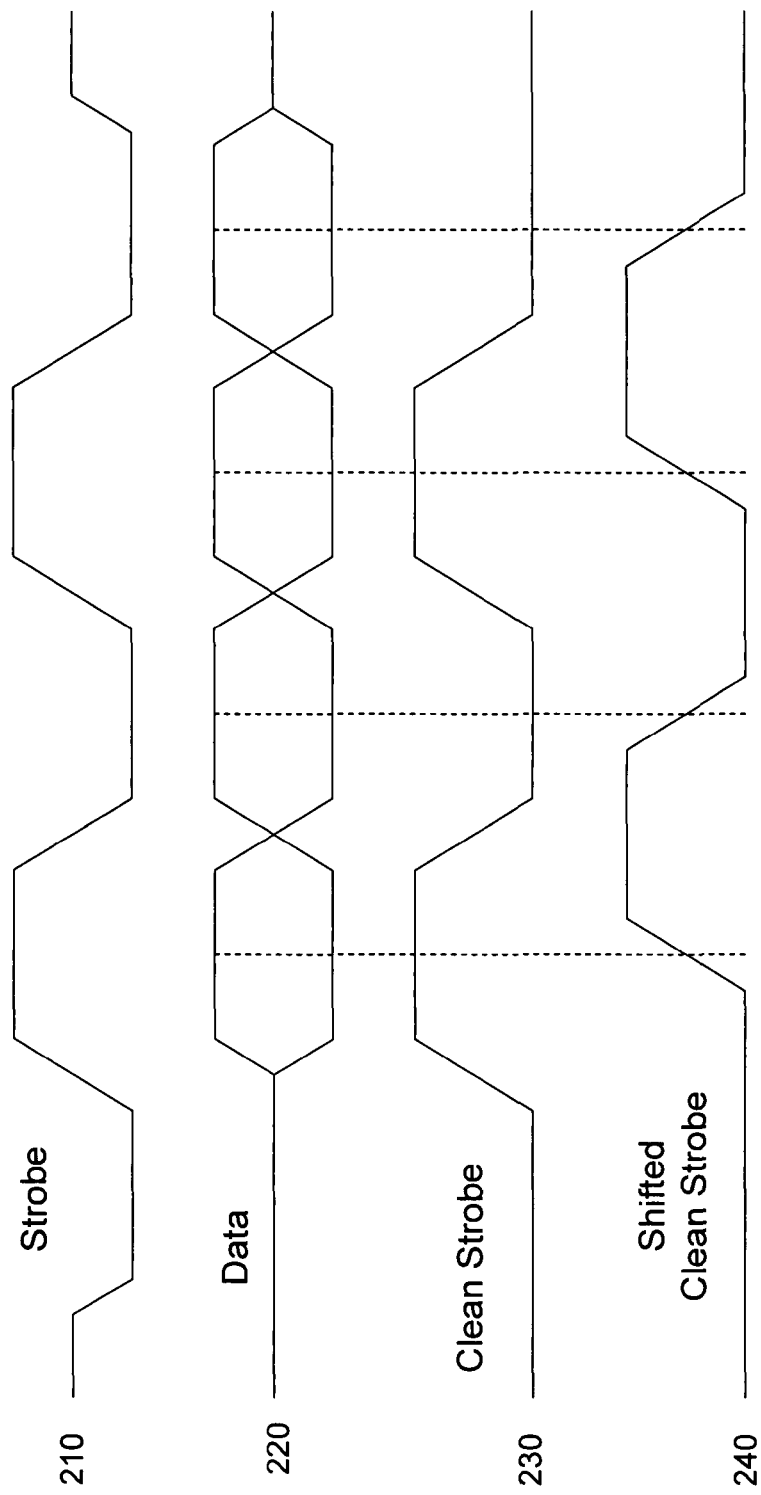
FIG. 2 is a timing diagram illustrating how a strobe signal is adjusted by a source synchronous capture unit according to an embodiment of the present invention.

FIG. 2 is a timing diagram illustrating how a strobe signal is adjusted by a source synchronous capture unit according to an embodiment of the present invention. Signal 210 is a strobe signal which is used for a non-free running clock. Signal 220 is a data signal. In some strobe-based applications, the strobe may go tri-state when data is not being read or written. In those cases, it is difficult to make use of the strobe directly for the capture. Signal 230 is a clean strobe signal. The clean strobe signal 230 represents the strobe signal 210 after being adjusted by a cleaning unit. Signal 240 is a shifted clean strobe signal. The shifted clean strobe signal 240 represents the clean strobe signal 230 after being adjusted by a shifting unit. As shown in FIG. 2, data from the data signal 220 may be captured by every edge of the shifted clean strobe signal 240 after being processed by the cleaning unit and shifting unit of a source synchronous capture unit. After the data capture, the data can be de-serialized such that two bits become available every negative clock edge, for example.

Referring back to FIG. 1, the source synchronous capture unit 100 includes a data register unit 130. The data register unit 130 is coupled to a first line that carries data and a second line that carries a non-free running clock (that has been cleaned and shifted by the cleaning unit 110 and shifting unit 120). The data register unit 130 registers data clocked in by the non-free running clock. Registering incoming source synchronous data is important because transfers from an input/output (IO) pin to a core of receiving device may introduce additional skew between the non-free running clock and the data that may cause capture failures of the data in the core, using the non-free running clock. Re-registering the data in the FPGA 10 periphery eliminates any data timing drift relative to the strobe that may have happened outside of the FPGA. This means the data transfer from the FPGA 10 periphery into the FPGA core has more margin after the re-registering. It is important to note that at this point, no re-synchronization into another domain has occurred yet. Only re-registered data synchronized to the strobe domain is available at this point. As mentioned earlier, another advantage of this re-registering is de-serialization can be easily done at the same time.

The source synchronous capture unit 100 includes a delay unit 140. The delay unit 140 is coupled to the shifting unit 120 and receives the non-free running clock. The delay unit 140 adds clock skew to delay the non-free running clock signal. The delay unit 140 may be implemented using hardware components dedicated to producing a delay. Alternatively, the delay unit 140 may be implemented using programmable routing. The delay unit 140 allows data to be written into an asynchronous FIFO using the same clock edge that is used to capture the data by the data register unit 130. This is important since a non-free running clock, such as a strobe, is not a continuous clock. For example, consider a receiving device that performs a double-data rate capture and de-serialization into a single-data rate, all synchronized to a non-free running clock, such as a strobe. If 4 bits of data are being received, there will only be 4 edges of the strobe (rising then falling then rising then falling). Two bits of data are made available at the data register unit 130 every negative edge of the strobe. After the second negative edge of the strobe, the last two bits of data are still at the data register unit 130 and only the first two bits of data have been written into the asynchronous FIFO unit. When the strobe stops, the last two bits of data will be "stranded" at the data register unit 130. The delay unit 130 allows the source synchronous capture unit 100 to prevent stranding bits of data at the data register unit 130 by having data written into the asynchronous FIFO unit use the same clock edge that is used to capture the data at the data register unit 130. All the data gets written into the asynchronous FIFO unit when the non-free running clock stops toggling.

According to an embodiment of the source synchronous capture unit 100, the data has "Delay" worth of time to travel from the data register unit 130 to the asynchronous FIFO. If "Delay" equals a period of the non-free running clock, the data has one period to travel. If "Delay" is larger, the data has even more time. In order to prevent data corruption at the asynchronous FIFO, there is a minimum data travel time of "Delay" minus the strobe period.

The data register unit 130 includes an asynchronous FIFO unit 150. The asynchronous FIFO unit 150 writes (stores) data received from the data register unit in response to the non-free running clock and reads (outputs) the data stored in the asynchronous FIFO unit 150 in response to a free running clock on the receiving device. The asynchronous FIFO unit 150 may be implemented by one or more FIFOs.

Figure 3:
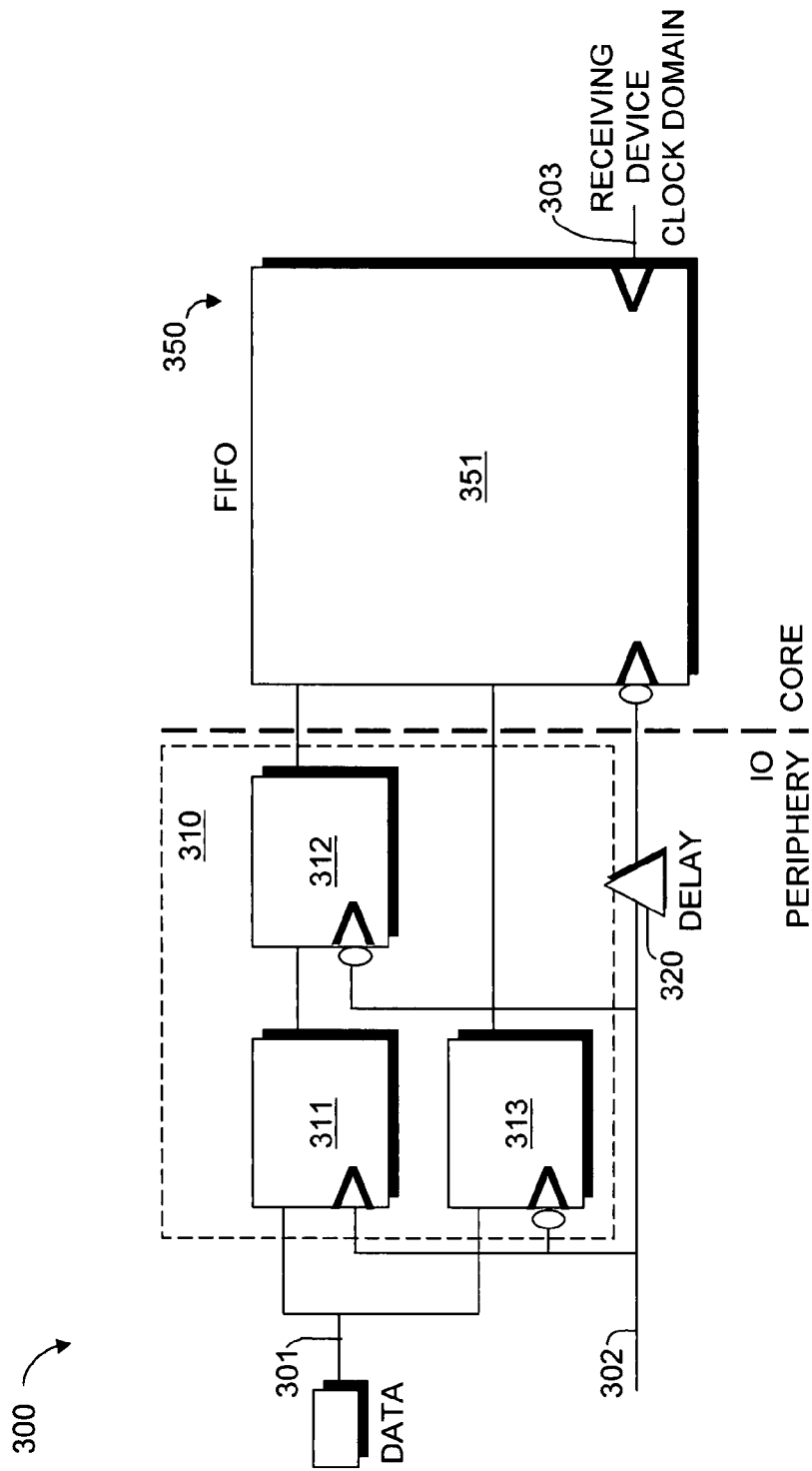
FIG. 3 illustrates a portion of a source synchronous capture unit implementing a single asynchronous FIFO according to an exemplary embodiment of the present invention.

FIG. 3 illustrates a portion of a source synchronous capture unit 300 implementing a single asynchronous FIFO according to an embodiment of the present invention. The source synchronous capture unit 300 includes a data register unit 310. The data register unit 310 includes a plurality of registers 311-313 that are coupled to a first line 301 that carries data and a second line 302 that carries a non-free running clock, such as a strobe. According to one embodiment, the second line 302 carries a strobe that has been cleaned and shifted. The data register unit 310 captures data received from the first line 301 and is synchronized to the non-free running clock on the second line 302.

The source synchronous capture unit 300 includes a delay unit 320. The delay unit 320 is coupled to the second line 302 that carries the non-free running clock. The delay unit 320 adds a delay to the non-free running clock that is transmitted to an asynchronous FIFO unit 350 in the source synchronous capture unit 300. The delay added to the non-free running clock allows data to be written to the asynchronous FIFO unit 350 using the same clock edge that is used to capture the data by the register unit 310.

The source synchronous capture unit 300 includes the asynchronous FIFO unit 350. The asynchronous FIFO unit 350 implements a single asynchronous FIFO 351 according to an exemplary embodiment of the present invention. The asynchronous FIFO 351 has a read side and a write side. The write side of the asynchronous FIFO 351 receives the non-free running clock from the delay unit 320 and writes data into the asynchronous FIFO 351 from the data register unit 310 in response to the non-free running clock. The read side of the asynchronous FIFO 351 is coupled to a third line 303 that carries a clock associated with the receiving device and reads data out from the asynchronous FIFO 351 in response to the clock associated with the receiving device. It should be noted that in some embodiments the asynchronous FIFO is implemented out of programmable core logic. This is done to permit a variety of asynchronous FIFO implementations, and more importantly, it avoids any permanent area penalty associated with dedicated FIFOs. The FIFOs are built based on design requirements only when needed.

Figure 4:
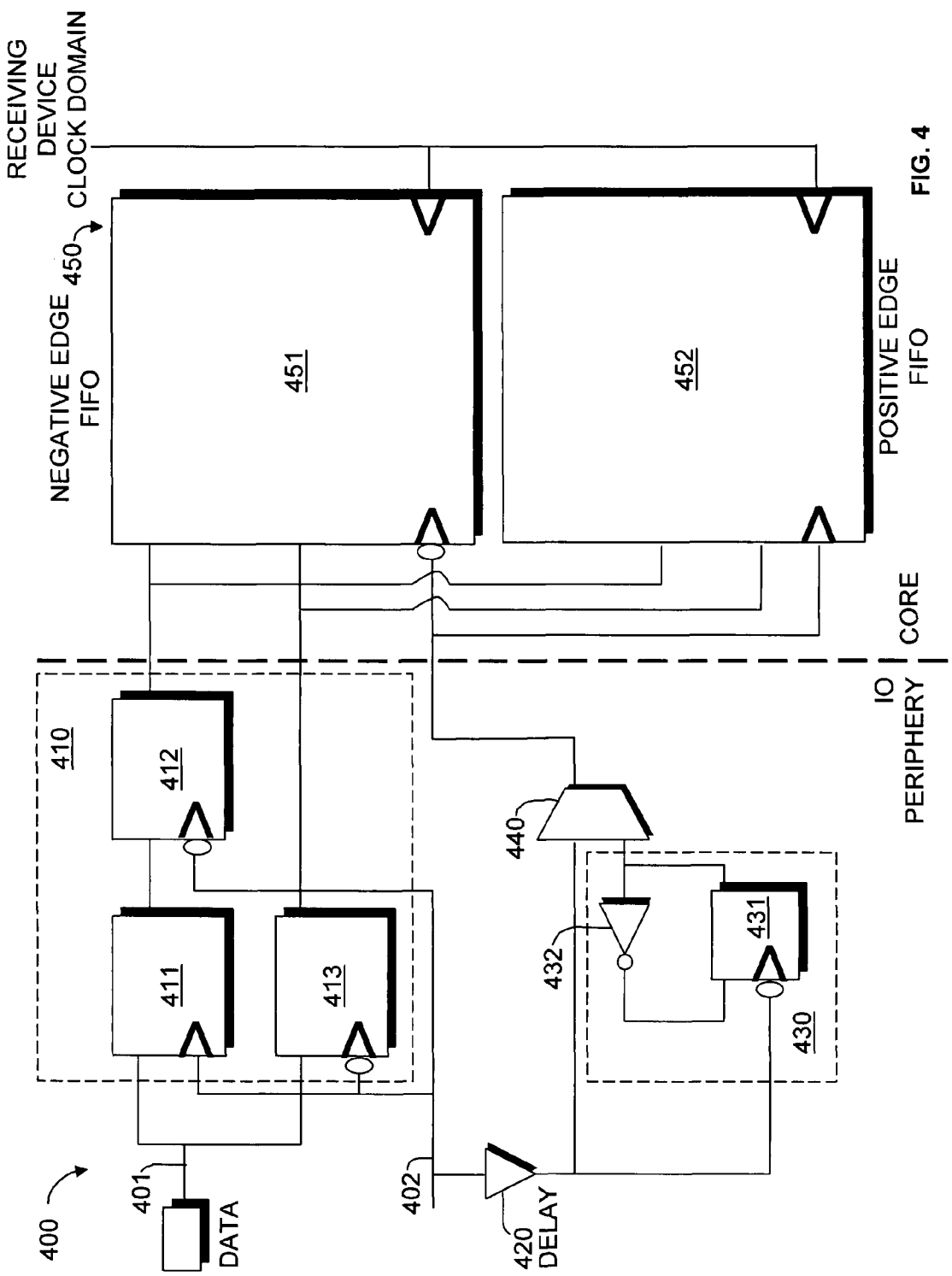
FIG. 4 illustrates a portion of a source synchronous capture unit implementing two asynchronous FIFOs according to an exemplary embodiment of the present invention.

FIG. 4 illustrates a portion of a source synchronous capture unit 400 implementing two asynchronous FIFOs according to an exemplary embodiment of the present invention. The source synchronous capture unit 400 includes a data register unit 410 similar to data register unit 310 shown in FIG. 3. The data register unit 410 includes a plurality of registers 411-413 that are coupled to a first line 401 that carries data and a second line 402 that carries a non-free running clock, such as a strobe. According to one embodiment, the second line 402 carries a strobe that has been cleaned and shifted. The data register unit 410 captures data received from the first line 401 and is synchronized to the non-free running clock on the second line 402.

The source synchronous capture unit 400 includes a delay unit 420 similar to the delay unit 320 shown in FIG. 3. The delay unit 420 is coupled to the second line 402 that carries the non-free running clock. The delay unit 420 adds a delay to the non-free running clock that is transmitted to an asynchronous FIFO unit 450 in the source synchronous capture unit 400. The delay added to the non-free running clock allows data to be written to the asynchronous FIFO unit 450 using the same clock edge that is used to capture the data by the register unit 410.

The source synchronous capture unit 400 includes a divider unit 430. The divider unit 430 receives the non-free running clock from the delay unit 420 and divides the non-free running clock. The divider unit 430 is implemented by a register 431 and an inverter 432.

The source synchronous capture unit 400 includes the asynchronous FIFO unit 450. The asynchronous FIFO unit 450 implements two asynchronous FIFOs 451 and 452 according to an exemplary embodiment of the present invention. The asynchronous FIFO 451 operates off the negative edge of the non-free running clock and asynchronous FIFO 452 clocks operates off the positive edge of the non-free running clock. This allows the asynchronous FIFOs 451 and 452 to operate at a lower frequency than the data bits are being captured at by the data register unit 410.

The speed at which logic can run in a programmable logic device may limit the maximum speed supported by strobe rate. The configuration of the source synchronous capture unit 400 allows data to be written into the asynchronous FIFOs 451 and 452 at half the rate of the strobe. Data is written into alternating asynchronous FIFOs, every falling edge of the strobe. In some embodiments, the FIFO speed need only be a quarter of the incoming data rate (the data is de-serialized in the register unit and again when being written to the FIFOs).

The asynchronous FIFOs 451 and 452 each have a read side and a write side. The write side of the asynchronous FIFOs 451 and 452 receive the non-free running clock from the delay unit 420 and write data into the asynchronous FIFOs 451 and 452 from the data register unit 410 in response to the non-free running clock. The read side of the asynchronous FIFOs 451 and 452 are fed by a clock in the receiving device, and read data out from the asynchronous FIFOs 451 and 452 in response to the receiving-device clock.

The source synchronous capture unit 400 may optionally include a multiplexer 440. The multiplexer 440 may be used to select one of either the non-free running clock signal from line 402 or a divided non-free running clock from the divider unit 430. In a situation where the strobe rate is supported by the speed at which logic can run in a programmable logic device, the non-free running clock signal from line 402 may be directly selected by the multiplexer 440 and only 1 asynchronous FIFO can be used as illustrated in FIG. 3. This avoids introducing additional logic when it is unneeded.

Figure 5:
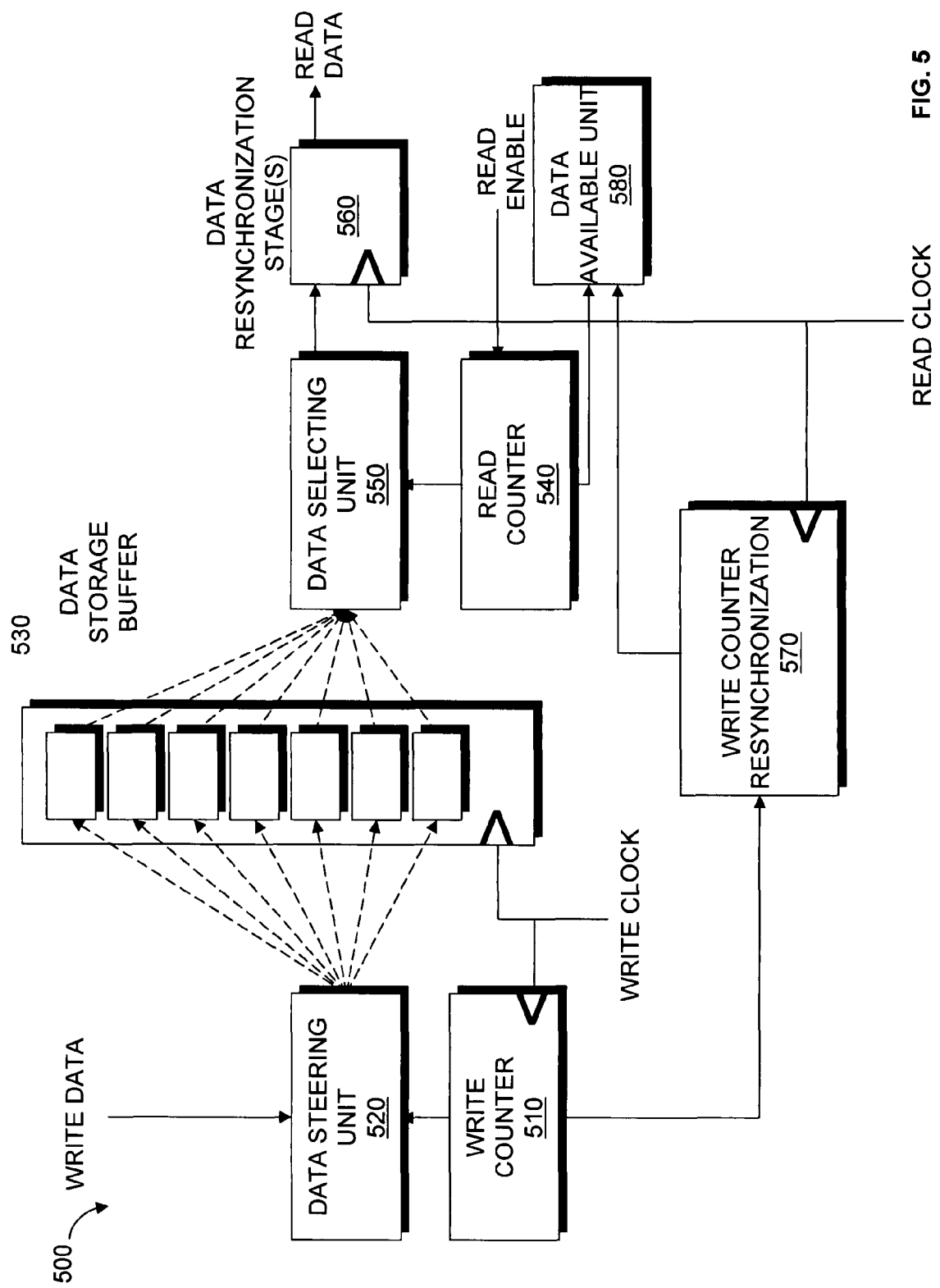
FIG. 5 illustrates the components in a FIFO according to an exemplary embodiment of the present invention.

FIG. 5 illustrates the components in an asynchronous FIFO 500 according to an exemplary embodiment of the present invention. The asynchronous FIFO 500 may be used to implement any one of the asynchronous FIFOs shown in FIGS. 3 and 4. The asynchronous FIFO 500 receives data (labeled "Write Data") from a first line 501, a non-free running clock signal (labeled "Write Clock") from a second line 502, and a receiving device clock (labeled "Read Clock") from a third line 503.

The asynchronous FIFO 500 includes a write counter 510. The write counter 510 receives the non-free running clock and increments its counter value with every rising or falling edge from the non-free running clock signal. According to an embodiment of the asynchronous FIFO 500, the write counter 510 is a Gray counter:

The asynchronous FIFO 500 includes a data steering unit 520. The data steering unit 520 is coupled to the first line and receives data. The data steering unit 520 is coupled to the write counter 510 and receives counter values. The data steering unit 520 steers the data received to the appropriate element (storage locations) in a data storage buffer in response to the counter values.

The asynchronous FIFO 500 includes a data storage buffer 530. The data storage buffer 530 includes a plurality of elements. The data storage buffer 530 is coupled to the non-free running clock and clocks data from the data steering unit 510 in response to the non-free running clock.

The asynchronous FIFO 500 includes a read counter 540. The read counter 540 is coupled to the third line 503 and receives the receiving device clock. The read counter 540 increments its counter value in response to the receiving device clock signal and a read enable signal that indicates that data had previously been read out successfully. According to an embodiment of the asynchronous FIFO 500, the read counter 540 is a Gray counter.

The asynchronous FIFO 500 includes a data selecting unit 550. The data selecting unit 550 is coupled to the read counter 540 and receives counter values. The data selecting unit 540 selects which element (storage location) in the data storage buffer to select to read from in response to the counter values.

The asynchronous FIFO 500 includes a data resynchronization stage 560. The data resynchronization stage 560 resynchronizes data from the domain of the non-free running clock (the "Write Clock" domain) into the domain of the receiving device clock (the "Read Clock" domain) so that the receiving device domain ("Read Clock" domain) can present the data synchronized to the receiving device clock.

The asynchronous FIFO 500 includes a write counter resynchronization unit 570. The write counter resynchronization unit 570 is coupled to the third line 503 and receives the receiving device clock. The write counter resynchronization unit 570 resynchronizes the write counter state into the receiving device domain (the "Read Clock" domain). To implement 560 and 570, cascades of registers for each bit being re-synchronized may be used. For example, some embodiments may use two registers in series for each bit being re-synchronized. The first register captures the data into the "new" clock domain, if the data happens to change at a clock edge, the register may go meta-stable for a short while. The purpose of the second register is to pass only the final decision of that first register once it has stabilized, and filter out the instability. The second register can be the output of the resynchronization unit. It will have stable data synchronized to the "new" clock domain.

The asynchronous FIFO 500 includes a data availability unit 580. The data availability unit 580 compares the re-synchronized write counter values with the read counter values to determine whether data is available for reading from the data storage buffer 530. If data is available for reading, the data available unit 580 generates an indication that the data from the data resynchronization stage 560 is valid.

According to an embodiment of the present invention, the asynchronous FIFO 500 is implemented such that the last data written to the asynchronous FIFO 500 can be read even if the non-free running clock (Write Clock) stops. That is, the asynchronous FIFO 500 should not have any write latency. This is important to avoid "stranding" data when the non-free running clock stops. The depth of the data storage buffer 530 can be sized so that there is never any chance of overflow (based on the application and the environment the asynchronous FIFO 500 is run in). If it is assumed that data will be read from the asynchronous FIFO 500 as soon as all the elements in the asynchronous FIFO 500 have the relevant data, the depth will mainly be a function of the maximum inter-strobe skews. As long as the asynchronous FIFO 500 is sized appropriately, there is no need for an overflow or full signal. Consequently, the only ports the asynchronous FIFO 500 needs is a write data port (for receiving data), write clock (for the non-free running clock), read data port, read clock (for the receiving device clock), and a data available flag.

There is an important timing consideration for the asynchronous FIFO 500. The timing of various paths must be met in order to ensure that the read data is valid when an indication is generated by the data available unit 580 that the read data is valid. For example, when the asynchronous FIFO 500 transitions from being empty to having some data, the valid data needs to be available at the output of the data resynchronization stage unit 560 when the write counter resynchronization unit 570 presents the up-to-date write counter state to the data available unit 580. According to an embodiment of the present invention, this may be achieved by delaying the path from the write counter 510 to the write counter resynchronization unit 570. According to an alternate embodiment of the present invention, the delay from the data storage buffer 530 to the data resynchronization stage unit 560 may be reduced. According to another embodiment of the present invention, the skew on the non-free running clock may be adjusted to delay the update of the write counter 510 relative to when data is written into the data storage buffer 530.

Figure 6:
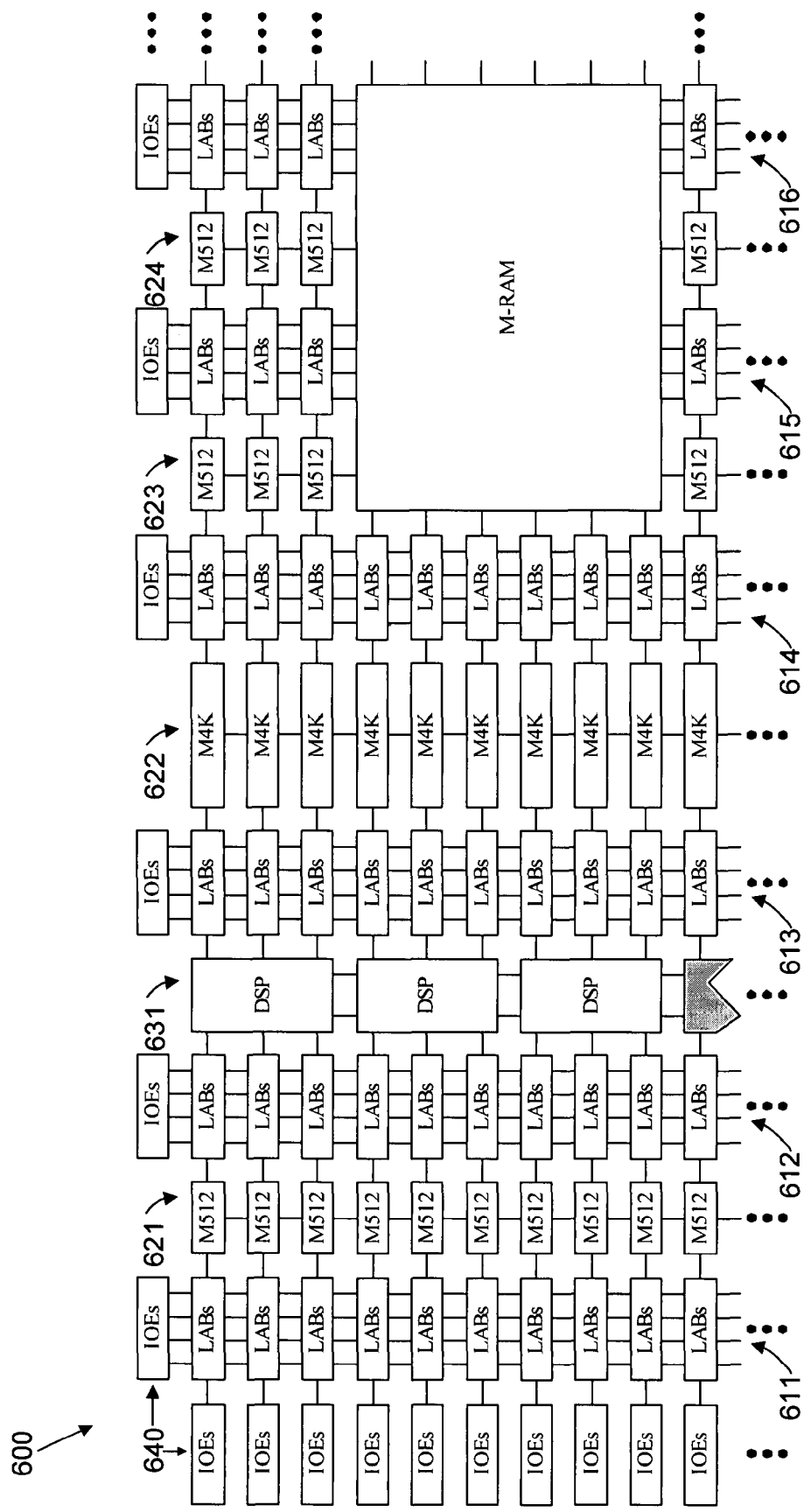
FIG. 6 illustrates a target device in which the source synchronous capture unit may be implemented on according to an exemplary embodiment of the present invention.

FIG. 6 illustrates a target device 600 in which the source synchronous capture unit may be implemented on according to an exemplary embodiment of the present invention. The target device 600 is an FPGA having a chip with a hierarchical structure that may take advantage of wiring locality properties of circuits formed therein.

The target device 600 includes a plurality of logic-array blocks (LABs). Each LAB may be formed from a plurality of logic blocks, carry chains, LAB control signals, (lookup table) LUT chain, and register chain connection lines. A logic block is a small unit of logic providing efficient implementation of user logic functions. A logic block includes one or more combinational cells and registers. According to one embodiment of the present invention, the logic block may operate similarly to a logic element (LE), or adaptive logic module (ALM), such as those found in Stratix™ and Stratix II™ manufactured by Altera® Corporation, or a slice such as those found in Virtex™, Virtex-II™, Virtex-II Pro™, or Virtex-4™ manufactured by Xilinx® Inc. In this embodiment, the logic block may include a four input lookup table (LUT) with a configurable register. Columns of LABs are shown as 611-616. It should be appreciated that the logic block may include additional or alternate components.

The target device 600 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the target device in between selected LABs or located individually or in pairs within the target device 600. Columns of memory blocks are shown as 621-624.

The target device 600 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the target device 600 and are shown as 631.

The target device 600 includes a plurality of input/output elements (IOEs) 640. Each IOE feeds an I/O pin (not shown) on the target device 600. The IOEs may be located at the end of LAB rows and columns around the periphery of the target device 600. Each IOE includes a bidirectional I/O buffer and a plurality of registers for registering input, output, and output-enable signals.

The target device 600 includes LAB local interconnect lines (not shown) that transfer signals between LEs in the same LAB. The LAB local interconnect lines are driven by column and row interconnects and LE outputs within the same LAB. Neighboring LABs, memory blocks, or DSP blocks may also drive the LAB local interconnect lines through direct link connections. The target device 600 also includes a plurality of row and column interconnect lines (not shown) that span fixed distances. Dedicated row and column interconnect lines, route signals to and from LABs, DSP blocks, and memory blocks within the same row and column, respectively.

As illustrated in FIGS. 3 and 4, the data register unit and delay/divider unit may be implemented at the input/output periphery (the IOEs in FIG. 6) and the asynchronous FIFO(s) may be implemented at the core of an FPGA (using the non-IOE blocks in FIG. 6). It should be appreciated that the data register unit, the delay/divider unit, and the FIFOs may be implemented at other locations on the FPGA. For example, in some embodiments, the delay/divider unit may be implemented in the core of the FPGA.

FIG. 6 illustrates an exemplary embodiment of a target device. It should be appreciated that a system may include a plurality of target devices, such as that illustrated in FIG. 6, cascaded together. It should also be appreciated that the target device may include FPGAs arranged in a manner different than that on the target device 600. A target device may also include FPGA resources other than those described in reference to the target device 600. Thus, while the invention described herein may be utilized on the architecture described in FIG. 6, it should be appreciated that it may also be utilized on different architectures, such as those employed by Altera® Corporation in its APEX™, Stratix™, Cyclone™, Stratix™ II, Cyclone™ II, MAX II™, Hardcopy™, Harcopy II™, Stratix GX™, and Stratix II GX™ families of chips and those employed by Xilinx® Inc. in its Spartan™, Spartan-II™, Spartan-3™, Virtex™, Virtex™ II, Virtex™ II Pro, and Virtex IV™ line of chips.

In the foregoing specification, embodiments of the invention have been described with reference to specific exemplary embodiments thereof. It will, however, be evident that various modifications and changes may be made thereto without departing from the broader spirit and scope of the embodiments of the invention. The specification and drawings are, accordingly, to be regarded in an illustrative rather than restrictive sense.

What is claimed is:

1. A source synchronous capture unit, comprising:
   a data register unit comprising a plurality of flip-flops operable to synchronize data to an edge of a non-free running clock to generate a synchronized data, wherein the plurality of flip-flops are coupled to a first line and a second line, wherein the first line is operable to carry the data and the second line is operable to carry the non-free running clock; and
   an asynchronous first-in-first-out (FIFO) unit operable to store the synchronized data in response to the edge of the non-free running clock, wherein the asynchronous FIFO unit is operable to output the stored synchronized data in response to a second clock.

2. The source synchronous capture unit of claim 1, further comprising a delay unit operable to delay the non-free running clock on the second line to the asynchronous FIFO unit such that a same clock edge on the non-free running clock that clocks the data into the data register unit is used to clock the synchronized data into the asynchronous FIFO.

3. The source synchronous capture unit of claim 1, wherein the asynchronous FIFO unit comprises a FIFO operable to store the synchronized data from the data register unit in response to positive or negative edges of the non-free running clock.

4. The source synchronous capture unit of claim 1, further comprising a divider unit operable to generate a lower frequency non-free running clock from said non-free running clock.

5. The source synchronous capture unit of claim 4, wherein the asynchronous FIFO unit comprises:
   a first FIFO operable to store the synchronized data from the data register unit in response to a negative edge of the lower frequency non-free running clock; and
   a second FIFO operable to store the synchronized data from the data register unit in response to a positive edge of the lower frequency non-free running clock.

6. The source synchronous capture unit of claim 4, further comprising:
   a multiplexer operable to select the non-free running clock or the lower frequency non-free running clock.

7. The source synchronous capture unit of claim 1, wherein the asynchronous FIFO unit comprises:
   a write counter,
   a data storage buffer; and
   a data steering unit.

8. The source synchronous capture unit of claim 1, wherein the asynchronous FIFO unit comprises:
   a write counter resynchronization unit;
   a read counter;
   a data available unit operable to produce a data available signal; and
   a data selecting unit.

9. The source synchronous capture unit of claim 7, wherein the write counter is a Gray counter.

10. The source synchronous capture unit of claim 8, wherein the read counter is Gray counter.

11. The source synchronous capture unit of claim 8, wherein the asynchronous FIFO unit further comprises a data re-synchronization stage.

12. The source synchronous capture unit of claim 1, further comprising a cleaning unit operable to prevent transitioning of its output between a high state and a low state in response to the non-free running clock being in tri-state, wherein its output is operable to be used directly for capture.

13. The source synchronous capture unit of claim 12, wherein the cleaning unit uses gating logic controlled by a timed enable signal.

14. The source synchronous capture unit of claim 12, wherein the cleaning unit uses analog circuitry to electrically interpret an intermediate voltage level as either high or low.

15. The source synchronous capture unit of claim 1, further comprising a shifting unit operable to adjust the non-free running clock, wherein edges of the non-free running clock are centered in a data valid window.

16. The source synchronous capture unit of claim 1, wherein the plurality of flip-flops comprises a first flip-flop coupled to the first line and the second line, and a second flip-flop coupled to the first line and an inversion of the second line.

17. A system, comprising:
    a transmitting device operable to transmit source synchronous data; and
    a receiving device operable to receive the source synchronous data, the receiving device includes a cleaning unit, a source synchronous capture unit, and an asynchronous first-in-first-out (FIFO) unit, wherein the cleaning unit is operable to prevent transitioning of its output between a high state and a low state in response to its input, a non-free running clock, being in tri-state, wherein the source synchronous capture unit includes a data register unit having a plurality of flip-flops operable to synchronize the source synchronous data to the non-free running clock, and wherein the asynchronous FIFO unit is operable to store the synchronized source synchronous data in response to the non-free running clock and to output the stored synchronized source synchronous data in response to a second clock.

18. The system of claim 17, wherein the source synchronous capture unit is implemented using a field programmable gate array (FPGA) device.

19. The system of claim 17, wherein the asynchronous FIFO unit comprises:
    a first FIFO operable to store the synchronized source synchronous data from the data register unit in response to a negative edge of a lower frequency non-free running clock; and a second FIFO operable to store the synchronized source synchronous data from the data register unit in response to a positive edge of the lower frequency non-free running clock.

20. The system of claim 19, wherein the synchronized data is stored in each of the first and second FIFOs at a rate lower than a rate of the non-free running clock.

21. A source synchronous capture unit, comprising:
means for preventing transitioning between a high state and a low state in response to a non-free running clock being in tri-state by forcing the non-free running clock to one of a high or low state;
means for synchronizing data that includes a plurality of flip-flops to synchronize data to the non-free running clock to generate synchronized data; and
means for storing the synchronized data in response to the non-free running clock and to output the stored synchronized data in response to a second clock.

22. The source synchronous capture unit of claim 21, wherein the means for storing the synchronized data comprises:
a first FIFO operable to store the synchronized data from the means for synchronizing data in response to a negative edge of a lower frequency non-free running clock; and
a second FIFO operable to store the synchronized data from the means for synchronizing data in response to a positive edge of the lower frequency non-free running clock.

* * * * *